United States Patent [19]

Gontier

[11] Patent Number: 4,858,816
[45] Date of Patent: Aug. 22, 1989

[54] TIN-SOLDERING MACHINE WITH AUTOMATIC WAVE BARRIER FOR PRINTED CIRCUIT BOARDS

[75] Inventor: Bruno Gontier, Amgeos, France

[73] Assignee: Societe Electronique de la Region Pays de Loire, Paris, France

[21] Appl. No.: 162,125

[22] Filed: Feb. 29, 1988

[30] Foreign Application Priority Data

Mar. 3, 1987 [FR] France .................... 87 02836

[51] Int. Cl.⁴ ............................................. H05K 3/34
[52] U.S. Cl. ........................................ 228/34; 228/37; 228/39; 228/214; 118/410; 118/678
[58] Field of Search ............ 228/34, 36, 37, 39, 228/214, 219; 118/410, 677, 678, 680

[56] References Cited

U.S. PATENT DOCUMENTS

| | | | |
|---|---|---|---|
| 3,379,356 | 4/1968 | Eith | 228/37 |
| 3,445,919 | 5/1969 | Saba | 228/34 |
| 3,506,478 | 4/1970 | Hudson et al. | 118/677 |
| 3,532,262 | 10/1970 | Laubmeyer et al. | 228/37 |
| 3,705,457 | 12/1972 | Tardoskegyi | 228/219 |
| 4,027,607 | 6/1977 | Pan et al. | 118/678 |

FOREIGN PATENT DOCUMENTS

| | | | |
|---|---|---|---|
| 2255240 | 5/1973 | Fed. Rep. of Germany | 228/37 |
| 1053990 | 11/1983 | U.S.S.R. | 228/37 |

OTHER PUBLICATIONS

Patent Abstracts of Japan, vol. 9, No. 94 (M-374) (1817) Apr. 24, 1985, JP-A-59 220 278 (Jiyapab Fuirudo K.K.) 11-12-1984.

Patent Abstracts of Japan, vol. 10, No. 273 (M-518) (2329), Sep. 17, 1986, & JP-A-61 95 768 (Kojima Press Co. Ltd.) 14-05-1986.

Primary Examiner—Nicholas P. Godici
Assistant Examiner—Samuel M. Heinrich
Attorney, Agent, or Firm—Oblon, Spivak, McClelland, Maier & Neustadt

[57] ABSTRACT

The wave barrier device of the invention comprises a flap which is rigidly joined to the soldering machine. This flap plunges lightly into the molten tin bath and pushes it before the board which is precedes.

8 Claims, 2 Drawing Sheets

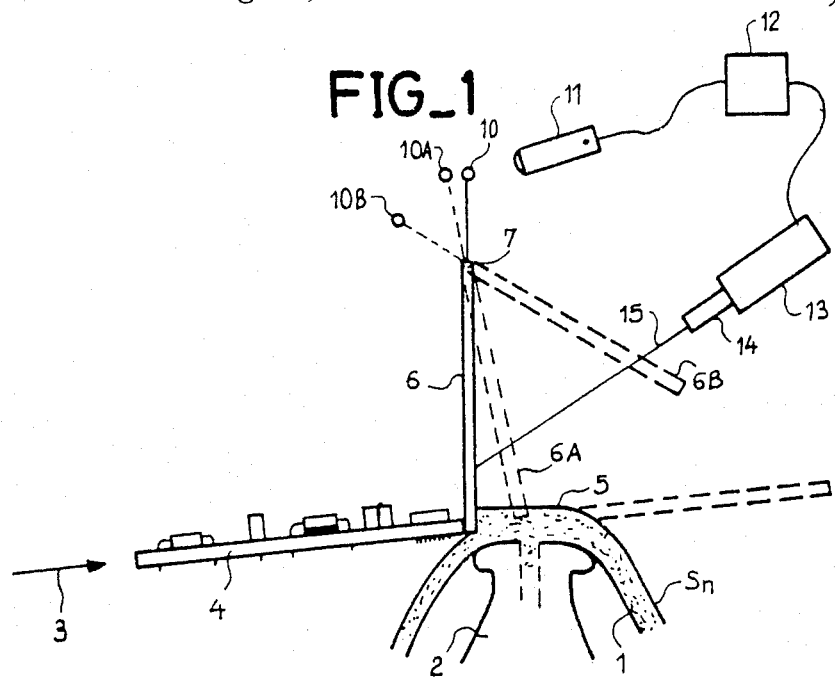
FIG_1
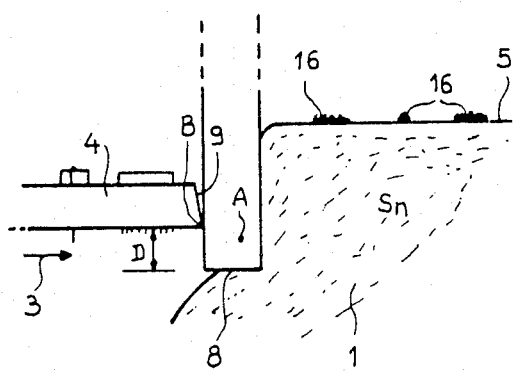
FIG_2
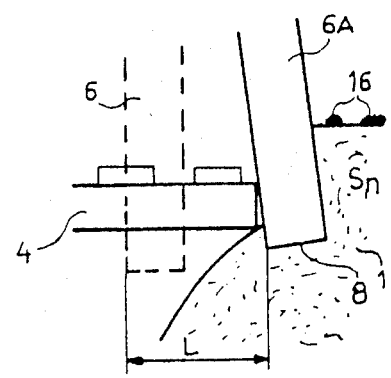
FIG_3

TIN-SOLDERING MACHINE WITH AUTOMATIC WAVE BARRIER FOR PRINTED CIRCUIT BOARDS

BACKGROUND OF THE INVENTION

1. Field of the Invention

An object of the present invention is a tin-soldering machine with an automatic wave barrier for printed circuit boards.

2. Description of the Prior Art

In electronic industries, where printed circuit boards are mass produced, components are soldered by the so-called "wave" soldering process in which a turbine maintains a constant output of molten lead-tin alloy that flows out over a spout with a specific shape.

The shape of the surface of the molten alloy, its flowing-out speed and its cleanness are major factors that determine the quality of the solders.

The geometry of the electronic board is also a determining factor: ideally, the board is flat and, in its translational motion, it approaches a rectilinear generating line of the surface of the molten alloy.

In practice, boards are not flat and have a tile shape which becomes accentuated with increasing width. The molten metal generating line is not rectilinear either, and its surface may be spoiled by dross.

It will be understood that, if the board to be soldered has a tile shape with downward convexity, there is a very great risk that, during the approach, the molten metal will flood the components side of the board which will then be irretrievably lost. If a compromise setting is attempted to avoid this problem, there is the risk that the components will not be soldered.

These reasons lead to the use of costly remedies, among them:

the addition of stiffeners to the electronic board itself. If the board contains power elements, the rigidity of the metallic radiators could be taken advantage of;

or, more generally, a soldering frame is used, in which the circuit is confined and which combines the functions that the electronic board cannot fulfil by itself, especially the wave barrier function.

SUMMARY OF THE INVENTION

An object of the invention is a soldering machine made so as to avoid any excess cost related to the board, or any additional manufacturing operations such as the placing of the board in a frame and then its withdrawal after soldering.

The soldering machine according to the invention has a wave barrier device which is rigidly joined to the machine. According to an advantageous feature of the invention, the wave barrier device has a part which brings down the level of the tin wave crest locally, just before the arrival of the leading edge of the board to be soldered.

According to an advantageous feature of the invention, the wave barrier device has a blade made of a material that does not melt at the temperature of molten tin. This blade penetrates the surface of the tin bath before the leading edge of the circuit to be soldered.

BRIEF DESCRIPTION OF THE DRAWINGS

The present invention will be better understood from the following detailed description of an embodiment, taken as a non-restrictive example and illustrated by the appended drawings, of which:

FIG. 1 is a simplified and partial side view of a soldering machine according to the invention, FIGS. 2 and 3 are enlarged views of details of the soldering machine of FIG. 1 at two different instants in the passage of a printed circuit board.

DESCRIPTION OF A PREFERRED EMBODIMENT

Figure 4:
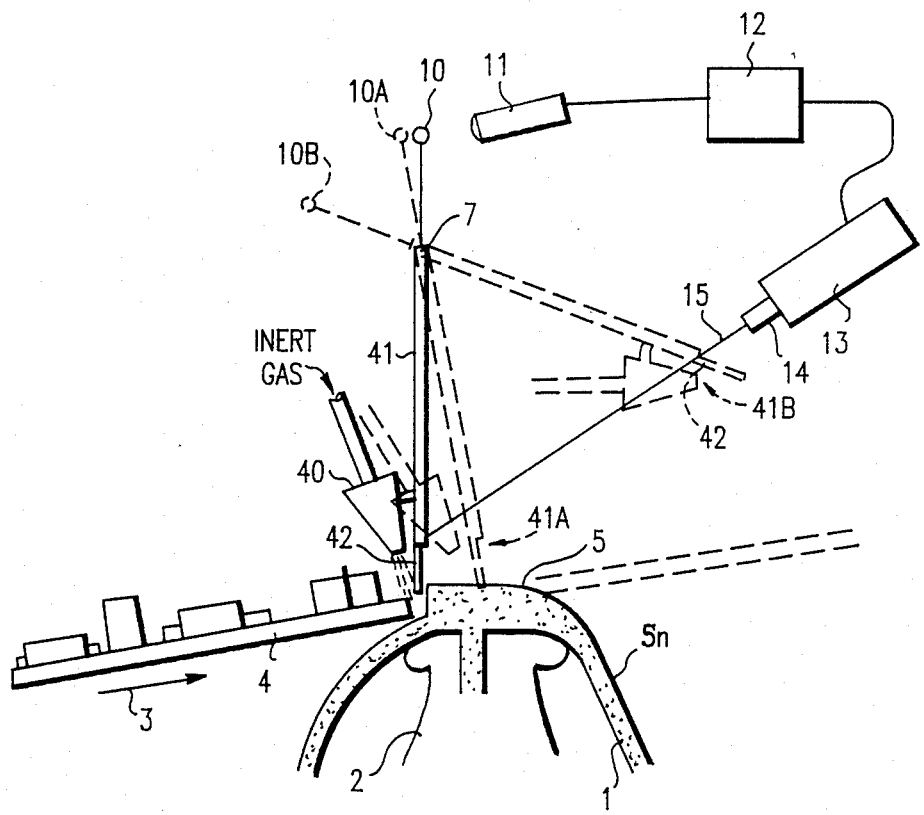
FIG. 4 is an alternate embodiment of Applicants' invention.

FIG. 1 is a schematic view of that part of a tin soldering machine which is at the tin wave 1. The term "tin" herein refers to any appropriate meltable soldering alloy or product that contains tin but not exclusively tin. The tin wave 1 is produced conventionally, using a nozzle 2. This wave 1 can be poured symmetrically upstream and downstream of the nozzle, as shown in the drawing, or else it can be poured non-symmetrically. An arrow 3 indicates the direction in which the machine conveyor moves. This conveyor carries printed circuit boards, provided with their components, such as the board 4 shown in the drawing. The relative positions of the conveyor and the nozzle are such that the upper side 5 of the tin wave 1 is at a higher level than the upper side of the board 4. This makes it necessary, with prior art machines, to have wave barriers placed in front of the boards (or supporting frames fitted with front walls acting as wave barriers) to prevent the upper side of the board from being flooded by the molten bath.

According to the invention, a movable wave barrier is placed on the machine. In the embodiment shown in the drawing, this wave barrier has a flap 6 which is mounted to be movable rotationally around a pin 7, from which it is suspended. This pin 7 is parallel to the planes of the main sides of the flap 6 and is perpendicular to the direction in which the conveyor moves. The flap 6 has a substantially rectangular shape and its width is substantially equal to the width of the board 4. In its idle position (shown in a solid line in FIG. 1), the flap 6 is placed in such a way that its lower lateral side 8 is at a distance D of approximately 2 to 3 mm. above the level of the lower side of the board 4, this side being therefore below the level 5. The pin 7 of the flap 6 is placed so that it is roughly perpendicular to a line A (of which only a point is shown in FIG. 2) which can be defined as the position that would be occupied by the leading edge B of the board 4 (the lower edge of the front side 9 of the board 4) on coming into contact with the wave 1 if the flap 6 did not exist.

A position-marking device 10, that works together with a position sensor 11, is fixed on the upper part of the flap 6. This sensor 11 may be either an optic type of sensor or an electromagnetic type of sensor or any other type of sensor. The sensor 11 is connected to a device 12 for the processing of data from the sensor and for the control of a jack 13 placed downstream of the flap 6. The making of the device 12 will be obvious to those skilled in the art from a reading of the present description, and depends on the type of sensor 11 and jack 13 used. The rod 14 of the jack 13 is connected to the flap 6 by means of a flexible connection 15, such as a chain or a cable. When the jack 13 is actuated by the device 12, it pulls the flap downstream (i.e. towards the right in the drawing).

The working of the machine described above is as follows. In the idle state, with the flap 6 in the position represented by a solid line in FIGS. 1 and 2, the conveyor approaches the board 4 until it makes contact with the flap 6. With the conveyor continuing to move forward, the board 4 pushes the flap 6 along a length L of approximately 1 to 2 cm. without anything happening.

As soon as the board 4 has travelled the length L, the flap 6 reaches the position marked 6A in FIGS. 1 and 3, and the position-marking device 10 reaches the position marked 10A. At this moment, the signal given by the sensor device 11 reaches a pre-determined threshold set in the device 12, thus making the latter excite the jack 13 which withdraws its rod 14 and thus pulls the flap 6 through the link 15. The characteristics of the jack 13 and its control are such that it moves the flap away in the downstream direction at a speed greater than that of the movement of the board 4. The jack 13 moves the flap away up to a position 6B (FIG. 1) such that the said flap can let the board 4 pass through without any risk that its components will touch the flap.

When the flap 6 starts moving from the idle position to the final position 6B (so long as it is in contact with the tin wave) pushes back the tin practically in the same way as would a conventional wave barrier. When the flap 6 moves quickly away from the position 6A towards the position 6B, it pushes the tin by creating a moving dip in the tin. This dip precedes the board 4 and prevents it from being submerged. The crest of the wave that follows this dip wets only the lower side of the board 4, depositing the solder at the requisite places.

The distances D and L, as well as the level 5 with respect to the level of the board 4, and the withdrawal speed of the jack 13 are set experimentally so as to provide for the optimum soldering of the leads or attachments of the components of the board 4.

The movement of the flap 6 also has the effect of pushing away, from the board 4, any dross 16 which might occur on the surface of the tin wave. A device (not shown) which can either detect the end of the passage o the board 4 or be activated at the end of a time lag, controls the outgoing of the rod 14 of the jack 13.

According to an variant (not shown) of the embodiment described above, the flap moves in a rectilinear translational movement while remaining substantially perpendicular to the direction 3 and then, when the board 4 is sufficiently engaged in the wave 11, the flap is lifted in a direction perpendicular to the direction 3 and then brought back to its "idle" position (the same position as in FIG. 1, but in this case, we could have D=0) after the passage of the board.

According to another embodiment of the invention, the flap is replaced by a movable nozzle that blows hot inert gas. This nozzle creates a "curtain" of gas just before the board 4 which it precedes and this curtain of gas produces a dip in the surface of the tim wave, preventing the tin from submerging the board.

What is claimed is:

1. A tin-soldering machine with a wave barrier for printed circuit boards comprising:
    a wave barrier device which moves in front of the circuit board as a function of the boards movement with respect to the machine and wherein said wave barrier is rigidly joined to the machine; and
    means for pushing the tin by creating a moving dip in the tin and wherein said dip proceeds the printed circuit board through the machine and which prevents said printed circuit board from being submerged.

2. A soldering machine according to claim 1, wherein the wave-barrier device comprises:
    a device which reduces the level of the tin wave crest just before the arrival of the leading edge of the board.

3. A soldering machine according to claim 2, wherein the wave barrier device comprises:
    a blade, made of a material that does not melt at the temperature of molten tin, said blade penetrating the surface of the tin wave before the leading edge of the circuit to be soldered.

4. A soldering machine according to claim 3 wherein the blade can move rotationally around a pin which is perpendicular to the direction in which the board moves.

5. A soldering machine according to claim 4, further comprising:
    means for pushing the blade by the board, during a first stage of its rotation, and then for quickly moving said blade away in the same direction to let the board pass through.

6. A soldering machine according to claim 3 further comprising:
    means for moving the blade in a rectilinear translational motion while remaining substantially perpendicular to the direction in which the board moves; and
    for then lifting said blade in a direction perpendicular to the said direction.

7. A soldering machine according to claim 1 wherein the wave barrier device comprises:
    a movable nozzle for blowing hot inert gas.

8. A tin-soldering machine with a wave barrier for printed circuit boards comprising:
    a wave barrier device which moves in front of a circuit board as a function of the board' movement in the machine and which is rigidly joined to the machine said wave barrier being comprised of a blade which is made of a material which does not melt at the temperature of molten tin;
    with said blade penetrating the surface of a tin wave before the leading edge of the circuit board to be soldered; and
    wherein said blade can move rotationally about a pin which is perpendicular to the direction at which the movement of the board occurs.

* * * * *